US012645141B2

(12) United States Patent
Woo et al.

(10) Patent No.: US 12,645,141 B2
(45) Date of Patent: Jun. 2, 2026

(54) SEMICONDUCTOR PHOTORESIST COMPOSITION AND METHOD OF FORMING PATTERNS USING THE COMPOSITION

(71) Applicant: SAMSUNG SDI CO., LTD., Yongin-si (KR)

(72) Inventors: Changsoo Woo, Suwon-si (KR); Seung Han, Suwon-si (KR); Seungyong Chae, Suwon-si (KR); Minyoung Lee, Suwon-si (KR); Jimin Kim, Suwon-si (KR); Sumin Jang, Suwon-si (KR); Sangkyun Im, Suwon-si (KR); Yaeun Seo, Suwon-si (KR); Eunmi Kang, Suwon-si (KR); Soobin Lim, Suwon-si (KR); Kyungsoo Moon, Suwon-si (KR)

(73) Assignee: Samsung SDI Co., Ltd., Yongin-si (KR)

( * ) Notice: Subject to any disclaimer, the term of this patent is extended or adjusted under 35 U.S.C. 154(b) by 562 days.

(21) Appl. No.: 18/323,358

(22) Filed: May 24, 2023

(65) Prior Publication Data

US 2024/0061336 A1 Feb. 22, 2024

(30) Foreign Application Priority Data

Aug. 2, 2022 (KR) ........................ 10-2022-0096208

(51) Int. Cl.
*G03F 7/039* (2006.01)
*G03F 7/004* (2006.01)

(52) U.S. Cl.
CPC ............ *G03F 7/039* (2013.01); *G03F 7/0044* (2013.01); *G03F 7/0045* (2013.01)

(58) Field of Classification Search
CPC ...... G03F 7/039; G03F 7/0044; G03F 7/0045; G03F 7/004; G03F 7/0042;

(Continued)

(56) References Cited

U.S. PATENT DOCUMENTS

| | | | |
|---|---|---|---|
| 5,061,599 | A | 10/1991 | Kudo et al. |
| 2011/0045406 | A1 | 2/2011 | Keszler et al. |

(Continued)

FOREIGN PATENT DOCUMENTS

| | | | |
|---|---|---|---|
| JP | 2020-021071 | A | 2/2020 |
| JP | 2020-184074 | A | 11/2020 |

(Continued)

OTHER PUBLICATIONS

Notice of Allowance dated Apr. 30, 2024 issued in corresponding Japanese Patent Application No. 2023-079880, 3 pages.

(Continued)

*Primary Examiner* — Stewart A Fraser
(74) *Attorney, Agent, or Firm* — Womble Bond Dickinson (US) LLP

(57) ABSTRACT

A semiconductor photoresist composition and a method of forming patterns utilizing the semiconductor photoresist composition are disclosed. The semiconductor photoresist composition may include a first organometallic compound represented by Chemical Formula 1, a second organometallic compound represented by Chemical Formula 2, and a solvent, where the first organometallic compound is different from the second organometallic compound, at least one selected from among $R^1$ and $L^1$ may include a tertiary carbon, and at least one selected from among $R^2$ and $L^2$ may include at least one selected from among a primary carbon and a secondary carbon.

Chemical Formula 1

(Continued)

-continued

Chemical Formula 2

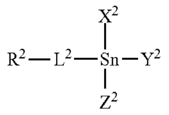

20 Claims, 3 Drawing Sheets

(58) Field of Classification Search
CPC ............. G03F 7/70033; H01L 21/0274; H01L 21/31144; H01L 21/32139
See application file for complete search history.

(56) References Cited

U.S. PATENT DOCUMENTS

| | | | |
|---|---|---|---|
| 2013/0224652 | A1 | 8/2013 | Bass et al. |
| 2017/0102612 | A1 | 4/2017 | Meyers et al. |
| 2020/0041897 | A1 | 2/2020 | Moon et al. |
| 2020/0348591 | A1 | 11/2020 | Kim et al. |
| 2021/0311387 | A1 | 10/2021 | Woo et al. |
| 2021/0356861 | A1 | 11/2021 | Han et al. |
| 2022/0194968 | A1 | 6/2022 | Moon |
| 2022/0197138 | A1 | 6/2022 | Moon et al. |
| 2023/0011781 | A1 | 1/2023 | Pun et al. |
| 2023/0374338 | A1 * | 11/2023 | Jilek .................... C09D 171/00 |

FOREIGN PATENT DOCUMENTS

| | | | |
|---|---|---|---|
| JP | 2021-162865 | A | 10/2021 |
| JP | 2021-179606 | A | 11/2021 |
| JP | 2022-97388 | A | 6/2022 |
| KR | 10-2014-0121826 | | 10/2014 |
| KR | 10-2017-0022945 | A | 3/2017 |
| KR | 10-2019-0139594 | A | 12/2019 |
| KR | 10-2020-0014216 | | 2/2020 |
| KR | 10-2020-0126884 | A | 11/2020 |
| KR | 10-2021-0044592 | A | 4/2021 |
| KR | 10-2021-0060219 | A | 5/2021 |
| KR | 10-2021-0094420 | A | 7/2021 |
| KR | 10-2021-0123138 | | 10/2021 |
| KR | 10-2021-0138416 | | 11/2021 |
| KR | 10-2022-0031647 | A | 3/2022 |
| KR | 10-2385745 | B1 | 4/2022 |
| KR | 10-2022-0088011 | | 6/2022 |
| KR | 10-2022-0088013 | | 6/2022 |
| TW | 202225178 | A | 7/2022 |
| TW | 202230049 | A | 8/2022 |
| WO | WO 2022/102636 | A1 | 5/2022 |
| WO | WO 2023-278878 | A1 | 1/2023 |
| WO | WO 2023/248878 | A1 | 12/2023 |

OTHER PUBLICATIONS

Anderson, C.N.; Baclea-An, L.-M.; Denham, P.; George,S.; Goldberg, K.A.; Jones, M.S.; Smith, S.S.; Wallow, T.I.; Montgomery, M.W.; Naulleau, P., The SEMATECH Berkeley MET: extending EUV learning to 16-nm half pitch, Proc. SPIE 7969, 79690R(2011).

H. Okamoto, T. Iwayanagi, K. Mochiji, H. Umezaki, T. Kudo, Peroxypolytungstic acids: A new inorganic resist material, Applied Physics Letters, 49(5), 298-300, 1986.

J. K. Stowers, A. Telecky, M. Kocsis, B. L. Clark, D. A. Keszler, A. Grenville, C. N. Anderson, P. P. Naulleau, Directly patterned inorganic hardmask for EUV lithography, Proc. SPIE, 7969, 796915, 2011.

Notice of Allowance dated Aug. 22, 2024 issued in corresponding Korean Patent Application No. 10-2022-0096208, 3 pages.

Taiwanese Office action dated Feb. 26, 2024 issued in corresponding TW Patent Application No. 112118241, 7 pages.

* cited by examiner

SEMICONDUCTOR PHOTORESIST COMPOSITION AND METHOD OF FORMING PATTERNS USING THE COMPOSITION

CROSS-REFERENCE TO RELATED APPLICATION

This application claims priority to and the benefit of Korean Patent Application No. 10-2022-0096208, filed in the Korean Intellectual Property Office on Aug. 2, 2022, the entire content of which is incorporated herein by reference.

BACKGROUND

1. Field

One or more embodiments of the disclosure relate to a semiconductor photoresist composition and a method of forming patterns utilizing the same.

2. Description of the Related Art

EUV (extreme ultraviolet) lithography has been drawing much attention as an important or essential technology for manufacturing a next generation semiconductor device. The EUV lithography is a pattern-forming technology utilizing an EUV ray having a wavelength of 13.5 nm as an exposure light source. According to the EUV lithography, it is known that an extremely fine pattern (e.g., less than or equal to 20 nm) may be formed in an exposure process during a manufacture of a semiconductor device.

The extreme ultraviolet (EUV) lithography is realized through development of compatible photoresists which can be performed at a spatial resolution of less than or equal to 16 nm. Currently, efforts to overcome insufficient specifications of chemically amplified (CA) photoresists such as a resolution, a photospeed, and feature roughness (also referred to as a line edge roughness or LER) for the next generation device are desired and/or being continuously made.

An intrinsic image blurring due to an acid catalyzed reaction in polymer-type or kind photoresists limits a resolution in small feature sizes, which has been well known in electron beam (e-beam) lithography for a long time. The chemically amplified (CA) photoresists are designed for high sensitivity, but because their typical elemental composition reduces light absorbance of the photoresists at a wavelength of 13.5 nm and thus decreases their sensitivity, the chemically amplified (CA) photoresists may have more difficulties under an EUV exposure.

In addition, the CA photoresists may also have problems in making the small feature sizes due to roughness issues. The line edge roughness (LER) of the CA photoresists experimentally turns out to be increased, as a photospeed is decreased, partially due to an essence of acid catalyst processes. Accordingly, a novel high-performance photoresist is required, desired, and/or needed in a semiconductor industry because of these defects and problems of the CA photoresists.

To overcome the aforementioned drawbacks of the chemically amplified (CA) organic photosensitive composition, an inorganic photosensitive composition has been researched. The inorganic photosensitive composition is mainly utilized for negative tone patterning having resistance against removal by a developer composition due to chemical modification through nonchemical amplification mechanism. The inorganic composition contains an inorganic element having a higher EUV absorption rate than hydrocarbon and thus may secure sensitivity through the nonchemical amplification mechanism and is less sensitive to a stochastic effect, and thus can have low line edge roughness and small number of defects.

Inorganic photoresists based on peroxopolyacids of tungsten mixed with tungsten, niobium, titanium, and/or tantalum have been utilized as radiation sensitive materials for patterning.

These materials are effective for patterning large pitches for a bilayer configuration for far ultraviolet (deep UV), X-ray, and electron beam sources. More recently, when cationic hafnium metal oxide sulfate (HfSOx) materials along with a peroxo complexing agent are utilized to image a 15 nm half-pitch (HP) through projection EUV exposure, desired performance has been obtained. This system appears to exhibit the highest performance of a non-CA photoresist and has a practical photospeed near to a requirement for an EUV photoresist. However, the hafnium metal oxide sulfate materials having the peroxo complexing agent have a few practical drawbacks. First, these materials are coated in a mixture of corrosive sulfuric acid/hydrogen peroxide and have insufficient shelf-life stability. Second, a structural change thereof for performance improvement as a composite mixture is not easy. Third, development is performed in a TMAH (tetramethylammonium hydroxide) solution at an extremely high concentration of 25 wt % and/or the like.

Recently, active research has been conducted on molecules containing tin that have excellent or suitable absorption of extreme ultraviolet rays. As for an organic tin polymer among them, alkyl ligands are dissociated by light absorption or secondary electrons produced thereby, and are cross-linked with adjacent chains through oxo bonds and thus enable the negative tone patterning that may not be removed by an organic developing solution. The organic tin polymer exhibits significantly improved sensitivity as well as maintains suitable resolution and line edge roughness, but the patterning characteristics need to be further improved for commercial availability.

SUMMARY

One or more aspects of embodiments of the present disclosure are directed toward a semiconductor photoresist composition capable of implementing a pattern with significantly improved sensitivity, resolution, and storage stability.

One or more aspects of embodiments of the present disclosure are directed toward a method of forming patterns utilizing the semiconductor photoresist composition.

Additional aspects will be set forth in part in the description which follows and, in part, will be apparent from the description, or may be learned by practice of the presented embodiments of the disclosure.

According to one or more embodiments, a semiconductor photoresist composition may include a first organometallic compound represented by Chemical Formula 1, a second organometallic compound represented by Chemical Formula 2, and a solvent.

Chemical Formula 1

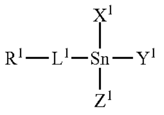

-continued

Chemical Formula 2

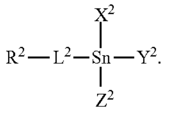

In Chemical Formula 1 and Chemical Formula 2, $R^1$ and $R^2$ may each independently be a substituted or unsubstituted C1 to C20 alkyl group, a substituted or unsubstituted C2 to C20 alkenyl group, a substituted or unsubstituted C2 to C20 alkynyl group, a substituted or unsubstituted C3 to C20 cycloalkyl group, a substituted or unsubstituted C3 to C20 cycloalkenyl group, a substituted or unsubstituted C3 to C20 cycloalkynyl group, a substituted or unsubstituted C1 to C20 alkoxy group, or a combination thereof, $L^1$ and $L^2$ may each independently be a single bond, a substituted or unsubstituted C1 to C20 alkylene group, a substituted or unsubstituted C2 to C20 alkenylene group, a substituted or unsubstituted C2 to C20 alkynylene group, or a combination thereof, at least one selected from among $R^1$ and $L^1$ may include a tertiary carbon, at least one selected from among $R^2$ and $L^2$ may include at least one selected from among a primary carbon and a secondary carbon, $X^1$, $X^2$, $Y^1$, $Y^2$, $Z^1$, and $Z^2$ may each independently be —$OR^a$, —$SR^b$, —$OC(=O)R^c$, or —$SC(=O)R^d$, $R^a$ and $R^b$ may each independently be a substituted or unsubstituted C1 to C20 alkyl group, a substituted or unsubstituted C3 to C20 cycloalkyl group, a substituted or unsubstituted C2 to C20 alkenyl group, a substituted or unsubstituted C2 to C20 alkynyl group, a substituted or unsubstituted C6 to C30 aryl group, or a combination thereof, and $R^c$ and $R^d$ may each independently be hydrogen, a substituted or unsubstituted C1 to C20 alkyl group, a substituted or unsubstituted C3 to C20 cycloalkyl group, a substituted or unsubstituted C2 to C20 alkenyl group, a substituted or unsubstituted C2 to C20 alkynyl group, a substituted or unsubstituted C6 to C30 aryl group, or a combination thereof.

In one or more embodiments, $R^1$ in Chemical Formula 1 may be a substituted or unsubstituted C1 to C20 alkyl group, a substituted or unsubstituted C2 to C20 alkenyl group, a substituted or unsubstituted C2 to C20 alkynyl group, a substituted or unsubstituted C1 to C20 alkoxy group, or a combination thereof, $L^1$ in Chemical Formula 1 may be a single bond, or a substituted or unsubstituted C1 to C20 alkylene group, and at least one selected from among $R^1$ and $L^1$ may include a tertiary carbon.

In one or more embodiments, the first organometallic compound may be represented by Chemical Formula 1-1 or Chemical Formula 1-2.

Chemical Formula 1-1

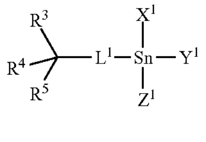

-continued

Chemical Formula 1-2

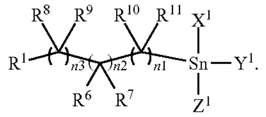

In Chemical Formula 1-1 and Chemical Formula 1-2, $R^3$ to $R^7$ may each independently be a substituted or unsubstituted C1 to C10 alkyl group, a substituted or unsubstituted C2 to C10 alkenyl group, a substituted or unsubstituted C2 to C10 alkynyl group, a substituted or unsubstituted C3 to C10 cycloalkyl group, a substituted or unsubstituted C3 to C10 cycloalkenyl group, a substituted or unsubstituted C3 to C10 cycloalkynyl group, a substituted or unsubstituted C1 to C10 alkoxy group, or a combination thereof, $L^1$ may be a single bond, a substituted or unsubstituted C1 to C20 alkylene group, a substituted or unsubstituted C2 to C20 alkenylene group, a substituted or unsubstituted C2 to C20 alkynylene group, or a combination thereof, $R^1$ may be a substituted or unsubstituted C1 to C10 alkyl group, a substituted or unsubstituted C2 to C10 alkenyl group, a substituted or unsubstituted C2 to C10 alkynyl group, a substituted or unsubstituted C3 to C10 cycloalkyl group, a substituted or unsubstituted C3 to C10 cycloalkenyl group, a substituted or unsubstituted C3 to C10 cycloalkynyl group, a substituted or unsubstituted C1 to C10 alkoxy group, or a combination thereof, $R^8$ to $R^{11}$ may each independently be hydrogen, a substituted or unsubstituted C1 to C10 alkyl group, a substituted or unsubstituted C3 to C10 cycloalkyl group, a substituted or unsubstituted C2 to C10 alkenyl group, a substituted or unsubstituted C2 to C10 alkynyl group, a substituted or unsubstituted C6 to C20 aryl group, or a combination thereof, n1 and n3 may each independently be an integer of 0 to 5, n2 may be one of integers from 1 to 5, $X^1$, $Y^1$, and $Z^1$ may each independently be —$OR^a$, —$SR^b$, —$OC(=O)R^c$, or —$SC(=O)R^d$, $R^a$ and $R^b$ may each independently be a substituted or unsubstituted C1 to C20 alkyl group, a substituted or unsubstituted C3 to C20 cycloalkyl group, a substituted or unsubstituted C2 to C20 alkenyl group, a substituted or unsubstituted C2 to C20 alkynyl group, a substituted or unsubstituted C6 to C30 aryl group, or a combination thereof, and $R^c$ and $R^d$ may each independently be hydrogen, a substituted or unsubstituted C1 to C20 alkyl group, a substituted or unsubstituted C3 to C20 cycloalkyl group, a substituted or unsubstituted C2 to C20 alkenyl group, a substituted or unsubstituted C2 to C20 alkynyl group, a substituted or unsubstituted C6 to C30 aryl group, or a combination thereof.

In one or more embodiments, $R^2$ in Chemical Formula 2 may be a substituted or unsubstituted C1 to C20 alkyl group, a substituted or unsubstituted C2 to C20 alkenyl group, a substituted or unsubstituted C2 to C20 alkynyl group, a substituted or unsubstituted C1 to C20 alkoxy group, or a combination thereof, $L^2$ in Chemical Formula 2 may be a single bond, or a substituted or unsubstituted C1 to C20 alkylene group, and at least one selected from among $R^2$ and $L^2$ may include at least one selected from among a primary carbon and a secondary carbon.

In one or more embodiments, the second organometallic compound may be represented by any one selected from among Chemical Formula 2-1 to Chemical Formula 2-4.

Chemical Formula 2-1

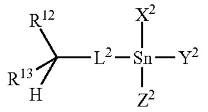

Chemical Formula 2-2

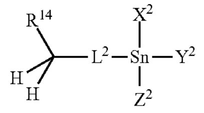

Chemical Formula 2-3

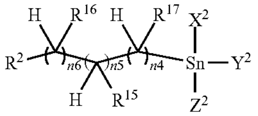

Chemical Formula 2-4

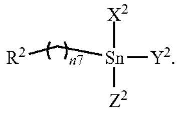

In Chemical Formula 2-1 to Chemical Formula 2-4, $R^{12}$ to $R^{15}$ may each independently be a substituted or unsubstituted C1 to C10 alkyl group, a substituted or unsubstituted C2 to C10 alkenyl group, a substituted or unsubstituted C2 to C10 alkynyl group, a substituted or unsubstituted C3 to C10 cycloalkyl group, a substituted or unsubstituted C3 to C10 cycloalkenyl group, a substituted or unsubstituted C3 to C10 cycloalkynyl group, a substituted or unsubstituted C1 to C10 alkoxy group, or a combination thereof, $L^2$ may be a single bond, a substituted or unsubstituted C1 to C20 alkylene group, a substituted or unsubstituted C2 to C20 alkenylene group, a substituted or unsubstituted C2 to C20 alkynylene group, or a combination thereof, $R^2$ may be a substituted or unsubstituted C1 to C10 alkyl group, a substituted or unsubstituted C2 to C10 alkenyl group, a substituted or unsubstituted C2 to C10 alkynyl group, a substituted or unsubstituted C3 to C10 cycloalkyl group, a substituted or unsubstituted C3 to C10 cycloalkenyl group, a substituted or unsubstituted C3 to C10 cycloalkynyl group, a substituted or unsubstituted C1 to C10 alkoxy group, or a combination thereof, $R^{16}$ and $R^{17}$ may each independently be hydrogen, a substituted or unsubstituted C1 to C10 alkyl group, a substituted or unsubstituted C3 to C10 cycloalkyl group, a substituted or unsubstituted C2 to C10 alkenyl group, a substituted or unsubstituted C2 to C10 alkynyl group, a substituted or unsubstituted C6 to C20 aryl group, or a combination thereof, n5 and n7 may each independently be an integer of 1 to 5, n4 and n6 may each independently be an integer of 0 to 5, $X^2$, $Y^2$, and $Z^2$ may each independently be —$OR^a$, —$SR^b$, —$OC(=O)R^c$, or —$SC(=O)R^d$, $R^a$ and $R^b$ may each independently be a substituted or unsubstituted C1 to C20 alkyl group, a substituted or unsubstituted C3 to C20 cycloalkyl group, a substituted or unsubstituted C2 to C20 alkenyl group, a substituted or unsubstituted C2 to C20 alkynyl group, a substituted or unsubstituted C6 to C30 aryl group, or a combination thereof, and $R^c$ and $R^d$ may each independently be hydrogen, a substituted or unsubstituted C1 to C20 alkyl group, a substituted or unsubstituted C3 to C20 cycloalkyl group, a substituted or unsubstituted C2 to C20 alkenyl group, a substituted or unsubstituted C2 to C20 alkynyl group, a substituted or unsubstituted C6 to C30 aryl group, or a combination thereof.

In one or more embodiments, $X^1$, $X^2$, $Y^1$, $Y^2$, $Z^1$, and $Z^2$ may each independently be —$OR^a$ or —$OC(=O)R^c$, $R^a$ may each independently be a substituted or unsubstituted C1 to C10 alkyl group, a substituted or unsubstituted C3 to C10 cycloalkyl group, a substituted or unsubstituted C2 to C10 alkenyl group, a substituted or unsubstituted C2 to C10 alkynyl group, a substituted or unsubstituted C6 to C20 aryl group, or a combination thereof, and $R^c$ may each independently be hydrogen, a substituted or unsubstituted C1 to C10 alkyl group, a substituted or unsubstituted C3 to C10 cycloalkyl group, a substituted or unsubstituted C2 to C10 alkenyl group, a substituted or unsubstituted C2 to C10 alkynyl group, a substituted or unsubstituted C6 to C20 aryl group, or a combination thereof.

In one or more embodiments, *-$L^1$-$R^1$ in Chemical Formula 1 may be a tert-butyl group, a tert-pentyl group, a tert-hexyl group, a tert-heptyl group, a tert-octyl group, a tert-nonyl group, or a tert-decyl group, and

*-$L^2$-$R^2$ in Chemical Formula 2 may be an n-propyl group, an n-butyl group, an n-pentyl group, an n-hexyl group, an n-heptyl group, an n-octyl group, an n-nonyl group, an n-decyl group, an iso-propyl group, an iso-butyl group, an iso-pentyl group, an iso-hexyl group, an iso-heptyl group, an iso-octyl group, an iso-nonyl group, an iso-decyl group, a sec-butyl group, a sec-pentyl group, a sec-hexyl group, a sec-heptyl group, or a sec-octyl group.

In one or more embodiments, the first organometallic compound and the second organometallic compound may be included in a weight ratio of about 99.9:0.1 to about 50:50.

In one or more embodiments, the first organometallic compound and the second organometallic compound may be included in a weight ratio of about 99:1 to about 70:30.

In one or more embodiments, based on 100 wt % of the semiconductor photoresist composition, a total amount of the organometallic compound including the first organometallic compound and the second organometallic compound may be about 0.5 wt % to about 30 wt %.

In one or more embodiments, the semiconductor photoresist composition may further include an additive of a surfactant, a crosslinking agent, a leveling agent, or a combination thereof.

According to one or more embodiments, a method of forming patterns may include forming an etching target layer on a substrate, coating the semiconductor photoresist composition on the etching target layer to form a photoresist layer, patterning the photoresist layer to form a photoresist pattern, and etching the etching target layer utilizing the photoresist pattern as an etching mask.

The photoresist pattern may be formed utilizing light in a wavelength of about 5 nm to about 150 nm.

The method of forming patterns may further include providing a resist underlayer formed between the substrate and the photoresist layer.

The photoresist pattern may have a width of about 5 nm to about 100 nm.

The semiconductor photoresist composition according to one or more embodiments may provide a photoresist pattern having improved sensitivity, resolution, and storage stability.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
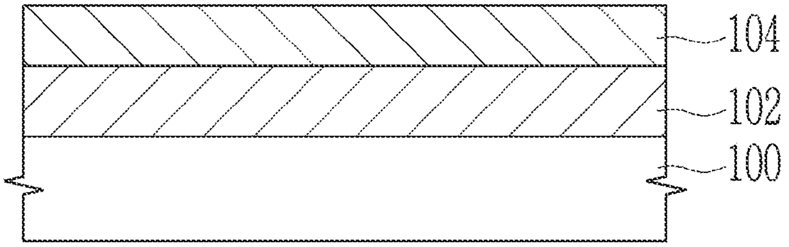
FIGS. 1-5 are cross-sectional views for illustrating a method of forming patterns utilizing a semiconductor photoresist composition according to one or more embodiments of the present disclosure.

The present disclosure may be modified in many alternate forms, and thus specific embodiments will be exemplified in the drawing and described in more detail. It should be understood, however, that it is not intended to limit the present disclosure to the particular forms disclosed, but rather, is intended to cover all modifications, equivalents, and alternatives falling within the spirit and scope of the present disclosure.

Hereinafter, referring to the drawings, embodiments of the present disclosure are described in more detail. In the following description of the present disclosure, the well-established functions or constructions will not be described in order to clarify the present disclosure.

In order to clearly illustrate the present disclosure, throughout the disclosure, the same or similar configuration elements are designated by the same reference numerals. Also, because the size and thickness of each configuration shown in the drawing are arbitrarily shown for better understanding and ease of description, the present disclosure is not necessarily limited thereto.

In the drawings, the thickness of layers, films, panels, regions, etc., may be exaggerated for clarity. In the drawings, the thickness of a part of layers or regions, etc., may be exaggerated for clarity. It will be understood that when an element such as a layer, film, region, or substrate is referred to as being "on" another element, it can be directly on the other element or intervening elements may also be present. In contrast, when an element is referred to as being "directly on" another element, there are no intervening elements present.

As utilized herein, "substituted" may refer to replacement of a hydrogen by deuterium, a halogen, a hydroxy group, a cyano group, a nitro group, —NRR' (wherein, R and R' may each independently be hydrogen, a substituted or unsubstituted C1 to C30 saturated or unsaturated aliphatic hydrocarbon group, a substituted or unsubstituted C3 to C30 saturated or unsaturated alicyclic hydrocarbon group, or a substituted or unsubstituted C6 to C30 aromatic hydrocarbon group), —SiRR'R" (wherein, R, R', and R" may each independently be hydrogen, a substituted or unsubstituted C1 to C30 saturated or unsaturated aliphatic hydrocarbon group, a substituted or unsubstituted C3 to C30 saturated or unsaturated alicyclic hydrocarbon group, or a substituted or unsubstituted C6 to C30 aromatic hydrocarbon group), a C1 to C30 alkyl group, a C1 to C10 haloalkyl group, a C1 to C10 alkylsilyl group, a C3 to C30 cycloalkyl group, a C6 to C30 aryl group, a C1 to C20 alkoxy group, or a combination thereof. "Unsubstituted" may refer to non-replacement of a hydrogen by another substituent and remaining of the hydrogen.

As utilized herein, when a definition is not otherwise provided, "an alkyl group" may refer to a linear or branched aliphatic hydrocarbon group. The alkyl group may be "a saturated alkyl group" without any double bond or triple bond.

The alkyl group may be a C1 to C10 alkyl group. For example, the alkyl group may be a C1 to C8 alkyl group, a C1 to C7 alkyl group, a C1 to C6 alkyl group, a C1 to C5 alkyl group, or a C1 to C4 alkyl group. For example, the C1 to C4 alkyl group may be a methyl group, an ethyl group, a propyl group, an isopropyl group, an n-butyl group, an isobutyl group, a sec-butyl group, a tert-butyl group, or a 2,2-dimethylpropyl group.

As utilized herein, when a definition is not otherwise provided, "cycloalkyl group" may refer to a monovalent cyclic aliphatic hydrocarbon group.

The cycloalkyl group may be a C3 to C10 cycloalkyl group, for example, a C3 to C8 cycloalkyl group, a C3 to C7 cycloalkyl group, a C3 to C6 cycloalkyl group, a C3 to C5 cycloalkyl group, or a C3 to C4 cycloalkyl group. For example, the cycloalkyl group may be a cyclopropyl group, a cyclobutyl group, a cyclopentyl group, or a cyclohexyl group, but is not limited thereto.

As utilized herein, "aryl group" may refer to a substituent in which all atoms in the cyclic substituent have a p-orbital and these p-orbitals are conjugated and may include a monocyclic or fused ring polycyclic functional group (i.e., rings sharing adjacent pairs of carbon atoms).

As utilized herein, when a definition is not otherwise provided, "alkenyl group" may refer to an aliphatic unsaturated alkenyl group including at least one double bond as a linear or branched aliphatic hydrocarbon group.

As utilized herein, unless otherwise defined, "alkynyl group" may refer to an aliphatic unsaturated alkynyl group including at least one triple bond as a linear or branched aliphatic hydrocarbon group.

In the formulas described herein, t-Bu may refer to a tert-butyl group.

Hereinafter, a semiconductor photoresist composition according to one or more embodiments will be described in more detail.

In one or more embodiments, the semiconductor photoresist composition may include a first organometallic compound, a second organometallic compound, and a solvent.

The first organometallic compound may be represented by Chemical Formula 1.

Chemical Formula 1

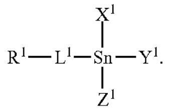

In Chemical Formula 1, $R^1$ may be a substituted or unsubstituted C1 to C20 alkyl group, a substituted or unsubstituted C2 to C20 alkenyl group, a substituted or unsubstituted C2 to C20 alkynyl group, a substituted or unsubstituted C3 to C20 cycloalkyl group, a substituted or unsubstituted C3 to C20 cycloalkenyl group, a substituted or unsubstituted C3 to C20 cycloalkynyl group, a substituted or unsubstituted C1 to C20 alkoxy group, or a combination thereof, $L^1$ may be a single bond, a substituted or unsubstituted C1 to C20 alkylene group, a substituted or unsubstituted C2 to C20 alkenylene group, a substituted or unsubstituted C2 to C20 alkynylene group, or a combination thereof, at least one selected from among $R^1$ and $L^1$ may include a tertiary carbon, $X^1$, $Y^1$, and $Z^1$ may each independently be —$OR^a$, —$SR^b$, —$OC(=O)R^c$, or —$SC(=O)R^d$, $R^a$ and $R^b$ may each independently be a substituted or unsubstituted C1 to C20 alkyl group, a substituted or unsubstituted C3 to C20 cycloalkyl group, a substituted or unsubstituted C2 to C20 alkenyl group, a substituted or unsubstituted C2 to C20 alkynyl group, a substituted or unsubstituted C6 to C30 aryl group, or a combination thereof, and $R^c$ and $R^d$ may each independently be hydrogen, a substituted or unsubstituted C1 to C20 alkyl group, a substituted or unsubstituted C3 to C20 cycloalkyl group, a substituted or unsubstituted C2 to C20 alkenyl group, a substituted or unsubstituted C2 to C20 alkynyl group, a substituted or unsubstituted C6 to C30 aryl group, or a combination thereof.

The tertiary carbon may refer to a carbon atom substituted with three other carbons. For example, a carbon atom in which three substitution sites are substituted with other carbons among tetravalent substitution sites around carbon is referred to as a tertiary carbon. As utilized herein, it is intended to define a carbon atom in which all other trivalent substitution sites are substituted with other carbons except for a portion linked to Sn as a tertiary carbon.

On the same basis, a primary carbon refers to a carbon atom in which one substitution site among the other trivalent substitution sites except for a portion linked to Sn are substituted with another carbon, and a secondary carbon refers to a carbon atom in which two substitution sites among the other trivalent substitution sites except for a portion linked to Sn are substituted with other carbons.

In one or more embodiments, the first organometallic compound included in the semiconductor photoresist composition may include a tertiary carbon at at least one selected from among $R^1$ and $L^1$ of Chemical Formula 1, wherein because the organometallic compound itself is stable, penetration of external moisture may be reduced.

Accordingly, excellent or suitable storage stability for solvents having reactivity and particularly, solvents having high reactivity against moisture, for example, alcohol-based, ester-based, or ketone-based solvents, may be achieved, and furthermore, excellent or suitable storage stability even for solvents containing more moisture in these solvents may be maintained.

In addition, sensitivity to extreme ultraviolet (EUV) of the organometallic compound may be improved due to the bulky structure.

For example, in one or more embodiments, $R^1$ in Chemical Formula 1 may be a substituted or unsubstituted C1 to C20 alkyl group, a substituted or unsubstituted C2 to C20 alkenyl group, a substituted or unsubstituted C2 to C20 alkynyl group, a substituted or unsubstituted C1 to C20 alkoxy group, or a combination thereof, $L^1$ in Chemical Formula 1 may be a single bond, or a substituted or unsubstituted C1 to C20 alkylene group, and at least one selected from among $R^1$ and $L^1$ may include a tertiary carbon.

In one or more embodiments, the first organometallic compound may be represented by Chemical Formula 1-1 or Chemical Formula 1-2.

Chemical Formula 1-1

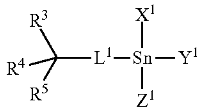

Chemical Formula 1-2

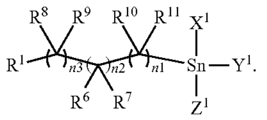

In Chemical Formula 1-1 and Chemical Formula 1-2, $R^3$ to $R^7$ may each independently be a substituted or unsubstituted C1 to C10 alkyl group, a substituted or unsubstituted C2 to C10 alkenyl group, a substituted or unsubstituted C2 to C10 alkynyl group, a substituted or unsubstituted C3 to C10 cycloalkyl group, a substituted or unsubstituted C3 to C10 cycloalkenyl group, a substituted or unsubstituted C3 to C10 cycloalkynyl group, a substituted or unsubstituted C1 to C10 alkoxy group, or a combination thereof, $L^1$ may be a single bond, a substituted or unsubstituted C1 to C20 alkylene group, a substituted or unsubstituted C2 to C20 alkenylene group, a substituted or unsubstituted C2 to C20 alkynylene group, or a combination thereof, $R^1$ may be a substituted or unsubstituted C1 to C10 alkyl group, a substituted or unsubstituted C2 to C10 alkenyl group, a substituted or unsubstituted C2 to C10 alkynyl group, a substituted or unsubstituted C3 to C10 cycloalkyl group, a substituted or unsubstituted C3 to C10 cycloalkenyl group, a substituted or unsubstituted C3 to C10 cycloalkynyl group, a substituted or unsubstituted C1 to C10 alkoxy group, or a combination thereof, $R^8$ to $R^{11}$ may each independently be hydrogen, a substituted or unsubstituted C1 to C10 alkyl group, a substituted or unsubstituted C3 to C10 cycloalkyl group, a substituted or unsubstituted C2 to C10 alkenyl group, a substituted or unsubstituted C2 to C10 alkynyl group, a substituted or unsubstituted C6 to C20 aryl group, or a combination thereof, n1 and n3 may each independently be an integer of 0 to 5, n2 may be one of integers from 1 to 5, $X^1$, $Y^1$, and $Z^1$ may each independently be —$OR^a$, —$SR^b$, —$OC(=O)R^c$, or —$SC(=O)R^d$, $R^a$ and $R^b$ may each independently be a substituted or unsubstituted C1 to C20 alkyl group, a substituted or unsubstituted C3 to C20 cycloalkyl group, a substituted or unsubstituted C2 to C20 alkenyl group, a substituted or unsubstituted C2 to C20 alkynyl group, a substituted or unsubstituted C6 to C30 aryl group, or a combination thereof, and $R^c$ and $R^d$ may each independently be hydrogen, a substituted or unsubstituted C1 to C20 alkyl group, a substituted or unsubstituted C3 to C20 cycloalkyl group, a substituted or unsubstituted C2 to C20 alkenyl group, a substituted or unsubstituted C2 to C20 alkynyl group, a substituted or unsubstituted C6 to C30 aryl group, or a combination thereof.

For example, in some embodiments, $*-L^1-R^1$ in Chemical Formula 1 may be a tert-butyl group, a tert-pentyl group, a tert-hexyl group, a tert-heptyl group, a tert-octyl group, a tert-nonyl group, or a tert-decyl group.

In one or more embodiments, the second organometallic compound may be represented by Chemical Formula 2.

Chemical Formula 2

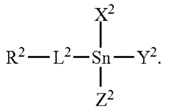

In Chemical Formula 2, $R^2$ may be a substituted or unsubstituted C1 to C20 alkyl group, a substituted or unsubstituted C2 to C20 alkenyl group, a substituted or unsubstituted C2 to C20 alkynyl group, a substituted or unsubstituted C3 to C20 cycloalkyl group, a substituted or unsubstituted C3 to C20 cycloalkenyl group, a substituted or unsubstituted C3 to C20 cycloalkynyl group, a substituted or unsubstituted C1 to C20 alkoxy group, or a combination thereof, $L^2$ may be a single bond, a substituted or unsubstituted C1 to C20 alkylene group, a substituted or unsubstituted C2 to C20 alkenylene group, a substituted or unsubstituted C2 to C20 alkynylene group, or a combination thereof, at least one selected from among $R^2$ and $L^2$ may include at least one selected from a primary carbon and a secondary carbon, $X^2$, $Y^2$, and $Z^2$ may each independently be —$OR^a$, —$SR^b$, —$OC(=O)R^c$, or —$SC(=O)R^d$, $R^a$ and $R^b$ may each independently be a substituted or unsubstituted C1 to C20 alkyl group, a substituted or unsubstituted C3 to C20 cycloalkyl group, a substituted or unsubstituted C2 to C20 alkenyl group, a substituted or unsubstituted C2 to C20 alkynyl group, a substituted or unsubstituted C6 to C30 aryl group, or a combination thereof, and $R^c$ and $R^d$ may each independently be hydrogen, a substituted or unsubstituted C1 to C20 alkyl group, a substituted or unsubstituted C3 to C20 cycloalkyl group, a substituted or unsubstituted C2 to C20 alkenyl group, a substituted or unsubstituted C2 to C20 alkynyl group, a substituted or unsubstituted C6 to C30 aryl group, or a combination thereof.

For example, in one or more embodiments, $R^2$ and $L^2$ of Chemical Formula 2 may be composed of the primary carbon and the secondary carbon. In other words, $R^2$ and $L^2$ of Chemical Formula 2 may include no tertiary carbon and thus may be distinguished from the organometallic compound represented by Chemical Formula 1.

When the organometallic compound represented by Chemical Formula 2 is included, excellent or suitable developability is secured, and low line edge roughness is achieved.

In other words, when the aforementioned two types (kinds) of organometallic compounds are concurrently (e.g., simultaneously) included, a semiconductor photoresist composition concurrently (e.g., simultaneously) having excellent or suitable sensitivity, line edge roughness, and storage stability may be obtained.

Furthermore, the organometallic compound is provided with solubility for an organic solvent by a $Sn-L^1-R^1$ or $Sn-L^2-R^2$ moiety. When exposed to extreme ultraviolet (UV) light, $R^1$ and $R^2$ functional groups are dissociated from the $Sn-L^1-R^1$ or $Sn-L^2-R^2$ moiety to generate radicals, and these radicals form an additional —Sn—O—Sn-bond to initiate a condensation polymerization reaction, so that the photoresist composition according to one or more embodiments may be formed into a semiconductor photoresist.

On the other hand, in some embodiments, the organometallic compound may further include three organic ligands forming Sn—O bonds in addition to the substituents $R^1$ and $R^2$. These organic ligands may be hydrolyzed with or without a heat treatment under an acidic or basic catalyst to form the Sn—O—Sn bond between organometallic compounds, thereby forming an organic metal copolymer.

For example, in one or more embodiments, $R^2$ in Chemical Formula 2 may be a substituted or unsubstituted C1 to C20 alkyl group, a substituted or unsubstituted C2 to C20 alkenyl group, a substituted or unsubstituted C2 to C20 alkynyl group, a substituted or unsubstituted C1 to C20 alkoxy group, or a combination thereof, $L^2$ in Chemical Formula 2 may be a single bond, or a substituted or unsubstituted C1 to C20 alkylene group, and at least one selected from among $R^2$ and $L^2$ may include at least one selected from among a primary carbon and a secondary carbon.

In one or more embodiments, the second organometallic compound may be represented by any one selected from among Chemical Formula 2-1 to Chemical Formula 2-4.

Chemical Formula 2-1

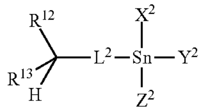

Chemical Formula 2-2

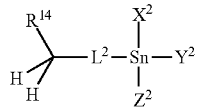

Chemical Formula 2-3

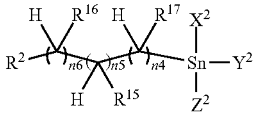

Chemical Formula 2-4

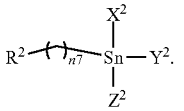

In Chemical Formula 2-1 to Chemical Formula 2-4, $R^{12}$ to $R^{15}$ may each independently be a substituted or unsubstituted C1 to C10 alkyl group, a substituted or unsubstituted C2 to C10 alkenyl group, a substituted or unsubstituted C2 to C10 alkynyl group, a substituted or unsubstituted C3 to C10 cycloalkyl group, a substituted or unsubstituted C3 to C10 cycloalkenyl group, a substituted or unsubstituted C3 to C10 cycloalkynyl group, a substituted or unsubstituted C1 to C10 alkoxy group, or a combination thereof, $L^2$ may be a single bond, a substituted or unsubstituted C1 to C20 alkylene group, a substituted or unsubstituted C2 to C20 alkenylene group, a substituted or unsubstituted C2 to C20 alkynylene group, or a combination thereof, $R^2$ may be a substituted or unsubstituted C1 to C10 alkyl group, a substituted or unsubstituted C2 to C10 alkenyl group, a substituted or unsubstituted C2 to C10 alkynyl group, a substituted or unsubstituted C3 to C10 cycloalkyl group, a substituted or unsubstituted C3 to C10 cycloalkenyl group, a substituted or unsubstituted C3 to C10 cycloalkynyl group, a substituted or unsubstituted C1 to C10 alkoxy group, or a combination thereof, $R^{16}$ and $R^{17}$ may each independently be hydrogen, a substituted or unsubstituted C1 to C10 alkyl group, a substituted or unsubstituted C3 to C10 cycloalkyl group, a substituted or unsubstituted C2 to C10 alkenyl group, a substituted or unsubstituted C2 to C10 alkynyl group, a substituted or unsubstituted C6 to C20 aryl group, or a combination thereof, n5 and n7 may each independently be an integer of 1 to 5, n4 and n6 may each independently be an integer of 0 to 5, $X^2$, $Y^2$, and $Z^2$ may each independently be —$OR^a$, —$SR^b$, —OC(═O)$R^c$, or —SC(═O)$R^d$, $R^a$ and $R^b$ may each independently be a substituted or unsubstituted C1 to C20 alkyl group, a substituted or unsubstituted C3 to C20 cycloalkyl group, a substituted or unsubstituted C2 to C20 alkenyl group, a substituted or unsubstituted C2 to C20 alkynyl group, a substituted or unsubstituted C6 to C30 aryl group, or a combination thereof, and $R^c$ and $R^d$ may each independently be hydrogen, a substituted or unsubstituted C1 to C20 alkyl group, a substituted or unsubstituted C3 to C20 cycloalkyl group, a substituted or unsubstituted C2 to C20 alkenyl group, a substituted or unsubstituted C2 to C20 alkynyl group, a substituted or unsubstituted C6 to C30 aryl group, or a combination thereof.

For example, in one or more embodiments, *-$L^2$-$R^2$ in Chemical Formula 2 may be an n-propyl group, an n-butyl group, an n-pentyl group, an n-hexyl group, an n-heptyl group, an n-octyl group, an n-nonyl group, an n-decyl group, an iso-propyl group, an iso-butyl group, an iso-pentyl group, an iso-hexyl group, an iso-heptyl group, an iso-octyl group, an iso-nonyl group, an iso-decyl group, a sec-butyl group, a sec-pentyl group, a sec-hexyl group, a sec-heptyl group, or a sec-octyl group.

In one or more embodiments, the semiconductor photoresist composition may include the second organometallic compound with the first organometallic compound and thus may improve sensitivity and line edge roughness of a pattern after the exposure, and storage stability, concurrently (e.g., simultaneously).

For example, in one or more embodiments, $X^1$, $X^2$, $Y^1$, $Y^2$, $Z^1$, and $Z^2$ may each independently be —$OR^a$ or —OC(═O)$R^c$, $R^a$ may each independently be a substituted or unsubstituted C1 to C10 alkyl group, a substituted or unsubstituted C3 to C10 cycloalkyl group, a substituted or unsubstituted C2 to C10 alkenyl group, a substituted or unsubstituted C2 to C10 alkynyl group, a substituted or unsubstituted C6 to C20 aryl group, or a combination thereof, and $R^c$ may be hydrogen, a substituted or unsubstituted C1 to C10 alkyl group, a substituted or unsubstituted C3 to C10 cycloalkyl group, a substituted or unsubstituted C2 to C10 alkenyl group, a substituted or unsubstituted C2 to C10 alkynyl group, a substituted or unsubstituted C6 to C20 aryl group, or a combination thereof.

In one or more embodiments, the first organometallic compound and the second organometallic compound may be included in a weight ratio of about 99.9:0.1 to about 50:50, for example, in a weight ratio of about 99:1 to about 60:40, or about 99:1 to about 70:30, and embodiments of the present disclosure are not limited thereto. When the weight ratio of the first organometallic compound to the second organometallic compound satisfies the above range, the semiconductor photoresist composition having excellent or suitable sensitivity and resolution may be provided.

In one or more embodiments, in the semiconductor photoresist composition, a total amount of the organometallic compound including the first organometallic compound and the second organometallic compound may be about 0.5 wt % to about 30 wt %, for example, about 1 wt % to about 25 wt %, for example, about 1 wt % to about 20 wt %, for example, about 1 wt % to about 15 wt %, for example, about 1 wt % to about 10 wt %, or for example, about 1 wt % to about 5 wt % based on 100 wt % of the semiconductor photoresist composition, but embodiments of the present disclosure are not limited thereto. When the organometallic compound is included in the content (e.g., amount) within the above range, storage stability and etch resistance of the semiconductor photoresist compositions are improved, and resolution characteristics are improved.

Because the semiconductor photoresist composition according to one or more embodiments of the present disclosure includes the first organometallic compound and the second organometallic compound at the same time (e.g., concurrently), the semiconductor photoresist composition having excellent or suitable sensitivity and pattern formation properties may be provided.

In one or more embodiments, the solvent of the semiconductor photoresist composition may be an organic solvent, and may be, for example, aromatic compounds (e.g., xylene, toluene, etc.), alcohols (e.g., 4-methyl-2-pentanol, 4-methyl-2-propanol, 1-butanol, methanol, isopropyl alcohol, 1-propanol), ethers (e.g., anisole, tetrahydrofuran), esters (n-butyl acetate, propylene glycol monomethyl ether acetate, ethyl acetate, ethyl lactate), ketones (e.g., methyl ethyl ketone, 2-heptanone), or a mixture thereof, but embodiments of the present disclosure are not limited thereto.

In one or more embodiments, the semiconductor photoresist composition may further include a resin in addition to the first organometallic compound, the second organometallic compound, and the solvent.

The resin may be a phenolic resin including at least one aromatic moiety selected from Group 1.

Group 1

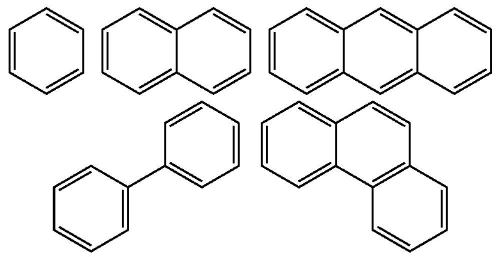

-continued

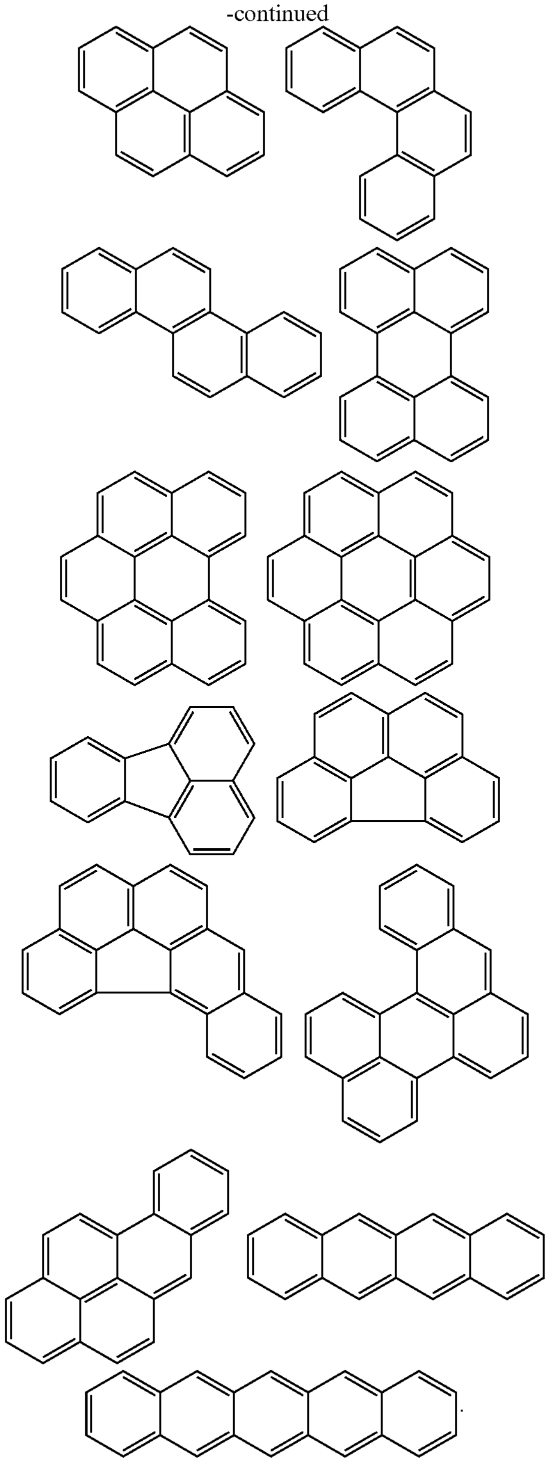

The resin may have a weight average molecular weight of about 500 to about 20,000.

The resin may be included in an amount of about 0.1 wt % to about 50 wt % based on the total amount of the semiconductor photoresist composition.

When the resin is included in the above content (e.g., amount) range, the semiconductor photoresist composition may have excellent or suitable etch resistance and heat resistance.

In some embodiments, the semiconductor photoresist composition may include (e.g., consist of) the aforementioned first organometallic compound, second organometallic compound, solvent, and resin. However, in some embodiments, the semiconductor photoresist composition may further include additives as needed. Non-limiting examples of the additives may be a surfactant, a crosslinking agent, a leveling agent, an organic acid, a quencher, or a combination thereof.

The surfactant may include, for example, an alkyl benzene sulfonate salt, an alkyl pyridinium salt, polyethylene glycol, a quaternary ammonium salt, or a combination thereof, but embodiments of the present disclosure are not limited thereto.

The crosslinking agent may be, for example, a melamine-based crosslinking agent, a substituted urea-based crosslinking agent, an acryl-based crosslinking agent, an epoxy-based crosslinking agent, and/or a polymer-based crosslinking agent, but embodiments of the present disclosure are not limited thereto. In some embodiments, it may be a crosslinking agent having at least two crosslinking-forming substituents, for example, a compound such as methoxymethylated glycoluril, butoxymethylated glycoluril, methoxymethylated melamine, butoxymethylated melamine, methoxymethylated benzoguanamine, butoxymethylated benzoguanamine, 4-hydroxybutyl acrylate, acrylic acid, urethane acrylate, acryl methacrylate, 1,4-butanediol diglycidyl ether, glycidol, diglycidyl 1,2-cyclohexane dicarboxylate, trimethylpropane triglycidyl ether, 1,3-bis(glycidoxypropyl)tetramethyldisiloxane, methoxymethylated urea, butoxymethylated urea, or methoxymethylated thiourea, and/or the like.

The leveling agent may be utilized for improving coating flatness during printing and may be a commercially available and suitable leveling agent.

The organic acid may be p-toluenesulfonic acid, benzenesulfonic acid, p-dodecylbenzene sulfonic acid, 1,4-naphthalene disulfonic acid, methane sulfonic acid, a fluorinated sulfonium salt, malonic acid, citric acid, propionic acid, methacrylic acid, oxalic acid, lactic acid, glycolic acid, succinic acid, or a combination thereof, but is not limited thereto.

The quencher may be diphenyl(p-tolyl) amine, methyl diphenyl amine, triphenyl amine, phenylenediamine, naphthylamine, diaminonaphthalene, or a combination thereof.

An amount of the additives in the semiconductor photoresist composition may be controlled or selected depending on desired or suitable properties.

In some embodiments, the semiconductor photoresist composition may further include a silane coupling agent as an adherence enhancer in order to improve a close-contacting force with the substrate (e.g., in order to improve adherence of the semiconductor photoresist composition to the substrate). The silane coupling agent may be, for example, a silane compound including a carbon-carbon unsaturated bond such as vinyltrimethoxysilane, vinyltriethoxysilane, vinyl trichlorosilane, vinyltris(β-methoxyethoxy)silane; 3-methacryloxypropyltrimethoxysilane, 3-acryloxypropyltrimethoxysilane, p-styryl trimethoxysilane, 3-methacryloxypropylmethyldimethoxysilane, 3-methacryloxypropylmethyl diethoxysilane; trimethoxy[3-(phenylamino)propyl]silane, and/or the like, but embodiments of the present disclosure are not limited thereto.

The semiconductor photoresist composition may be formed into a pattern having a high aspect ratio without a collapse. Accordingly, in order to form a fine pattern having a width of, for example, about 5 nm to about 100 nm, for example, about 5 nm to about 80 nm, for example, about 5 nm to about 70 nm, for example, about 5 nm to about 50 nm, for example, about 5 nm to about 40 nm, for example, about 5 nm to about 30 nm, or for example, about 5 nm to about 20 nm, the semiconductor photoresist composition may be utilized for a photoresist process utilizing light in a wavelength in a range of about 5 nm to about 150 nm, for example, about 5 nm to about 100 nm, about 5 nm to about 80 nm, about 5 nm to about 50 nm, about 5 nm to about 30 nm, or about 5 nm to about 20 nm. Thus, the semiconductor photoresist composition according to one or more embodiments of the present disclosure may be utilized to realize extreme ultraviolet lithography utilizing an EUV light source of a wavelength of about 13.5 nm.

According to one or more embodiments, a method of forming patterns utilizing the aforementioned semiconductor photoresist composition is provided. For example, the manufactured/formed pattern may be a photoresist pattern.

In one or more embodiments, the method of forming patterns may include forming an etching target layer on a substrate, coating the semiconductor photoresist composition on the etching target layer to form a photoresist layer, patterning the photoresist layer to form a photoresist pattern, and etching the etching target layer utilizing the photoresist pattern as an etching mask.

Hereinafter, a method of forming patterns utilizing the semiconductor photoresist composition will be described referring to FIGS. 1 to 5. FIGS. 1 to 5 are cross-sectional views for explaining a method of forming patterns utilizing a semiconductor photoresist composition according to one or more embodiments of the present disclosure.

Referring to FIG. 1, a target for etching (e.g., an etching target layer) is prepared and provided. The target for etching may be a thin film 102 formed on a semiconductor substrate 100. Hereinafter, the target for etching is limited to the thin film 102. A whole surface of the thin film 102 is washed to remove impurities and/or the like remaining thereon. In some embodiments, the thin film 102 may be, for example, a silicon nitride layer, a polysilicon layer, or a silicon oxide layer.

Subsequently, a resist underlayer composition for forming a resist underlayer 104 is spin-coated on the surface of the washed/cleaned thin film 102. However, embodiments of the present disclosure are not limited thereto, and any suitable coating methods, for example, a spray coating, a dip coating, a knife edge coating, a printing method such as an inkjet printing and a screen printing, and/or the like may be utilized.

In some embodiments, the coating process of the resist underlayer may not be provided, but hereinafter, a process including a coating of the resist underlayer is described.

Then, the coated resist underlayer composition is dried and baked to form a resist underlayer 104 on the thin film 102. The baking may be performed at about 100° C. to about 500° C., for example, about 100° C. to about 300° C.

The resist underlayer 104 is formed between the substrate 100 and a photoresist layer 106 and thus may prevent or reduce non-uniformity and pattern-forming capability of a photoresist line width when a ray reflected from the interface between the substrate 100 and the photoresist layer 106 or a hardmask between layers is scattered into an unintended photoresist region.

Figure 2:
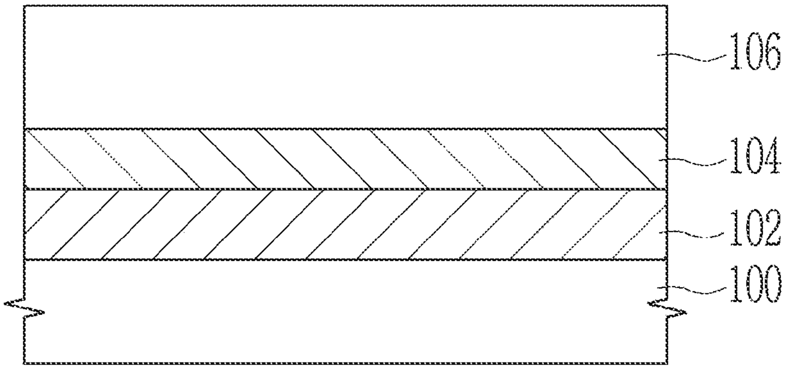

Referring to FIG. 2, the photoresist layer 106 is formed by coating the semiconductor photoresist composition on the resist underlayer 104. The photoresist layer 106 is obtained by coating the aforementioned semiconductor photoresist composition on the thin film 102 formed on the substrate 100 and then, curing it through a heat treatment.

In some embodiments, the formation of the photoresist layer by utilizing the semiconductor photoresist composition may include coating the semiconductor photoresist composition on the substrate 100 having the thin film 102 through spin coating, slit coating, inkjet printing, and/or the like and then, drying it to form the photoresist layer 106.

The semiconductor photoresist composition has already been illustrated in more detail and will not be illustrated again for conciseness.

Subsequently, the substrate 100 having the photoresist layer 106 is subjected to a first baking process. The first baking process may be performed at about 80° C. to about 120° C.

Figure 3:
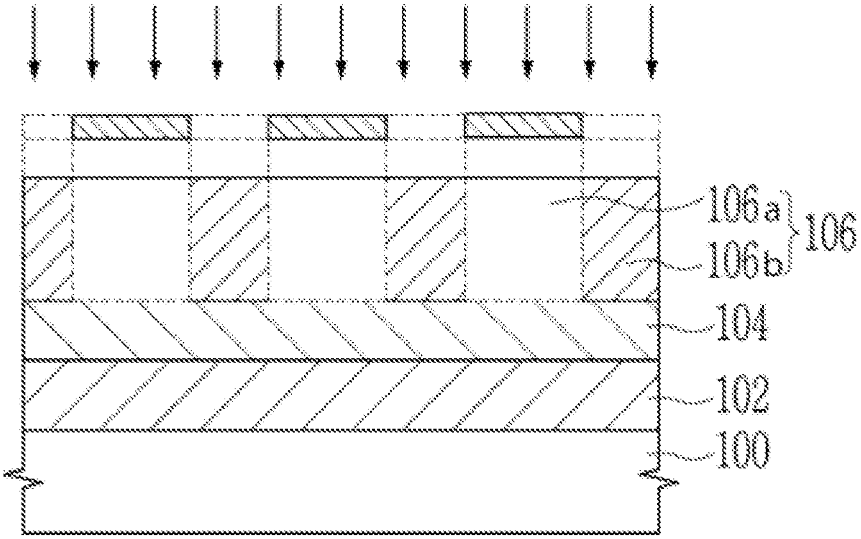

Referring to FIG. 3, the photoresist layer 106 may be selectively exposed.

For example, the exposure may utilize an activation radiation with light having a high energy wavelength such as EUV (extreme ultraviolet; a wavelength of 13.5 nm), an E-Beam (an electron beam), and/or the like as well as a short wavelength such as an i-line (a wavelength of 365 nm), a KrF excimer laser (a wavelength of 248 nm), an ArF excimer laser (a wavelength of 193 nm), and/or the like.

In one or more embodiments, light for the exposure may have a wavelength in a range of about 5 nm to about 150 nm or a high energy wavelength, for example, EUV (extreme ultraviolet; a wavelength of 13.5 nm), an E-Beam (an electron beam), and/or the like.

The exposed region 106*b* of the photoresist layer 106 has a different solubility from the non-exposed region 106*a* of the photoresist layer 106 by forming a polymer by a cross-linking reaction such as condensation between organometallic compounds.

Subsequently, the substrate 100 is subjected to a second baking process. The second baking process may be performed at a temperature of about 90° C. to about 200° C. The exposed region 106*b* of the photoresist layer 106 becomes indissoluble regarding a developing solution due to the second baking process.

Figure 4:
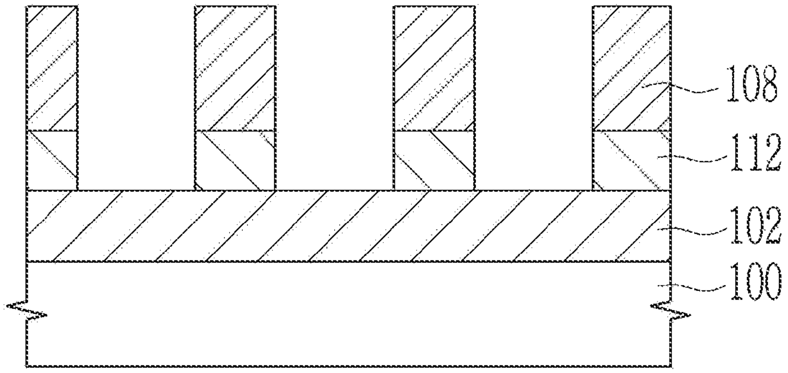

In FIG. 4, the non-exposed region 106*a* of the photoresist layer is dissolved and removed utilizing the developing solution to form a photoresist pattern 108. For example, the non-exposed region 106*a* of the photoresist layer is dissolved and removed by utilizing an organic solvent such as 2-heptanone and/or the like to complete the photoresist pattern 108 corresponding to a negative tone image.

As described above, the developing solution utilized in the method of forming patterns according to one or more embodiments may be an organic solvent. The organic solvent utilized in the method of forming patterns according to one or more embodiments may be, for example, ketones such as methylethylketone, acetone, cyclohexanone, 2-heptanone, and/or the like, alcohols such as 4-methyl-2-propanol, 1-butanol, isopropanol, 1-propanol, methanol, and/or the like, esters such as propylene glycol monomethyl ether acetate, ethyl acetate, ethyl lactate, n-butyl acetate, butyrolactone, and/or the like, aromatic compounds such as benzene, xylene, toluene, and/or the like, or a combination thereof.

However, the photoresist pattern according to one or more embodiments is not necessarily limited to the negative tone image but may be formed to have a positive tone image. In one or more embodiments, a developer utilized for forming the positive tone image may be a quaternary ammonium hydroxide composition such as tetraethylammonium hydroxide, tetrapropylammonium hydroxide, tetrabutylammonium hydroxide, or a combination thereof.

In one or more embodiments, exposure to light having a high energy such as EUV (extreme ultraviolet; a wavelength of 13.5 nm), an E-Beam (an electron beam), and/or the like as well as light having a wavelength such as i-line (wavelength of 365 nm), KrF excimer laser (wavelength of 248 nm), ArF excimer laser (wavelength of 193 nm), and/or the like may provide a photoresist pattern 108 having a width of about 5 nm to about 100 nm. For example, the photoresist pattern 108 may have a width of about 5 nm to about 90 nm, about 5 nm to about 80 nm, about 5 nm to about 70 nm, about 5 nm to about 60 nm, about 5 nm to about 50 nm, about 5 nm to about 40 nm, about 5 nm to about 30 nm, or about 5 nm to about 20 nm.

In one or more embodiments, the photoresist pattern 108 may have a pitch of having a half-pitch of less than or equal to about 50 nm, for example, less than or equal to about 40 nm, for example, less than or equal to about 30 nm, for example, less than or equal to about 20 nm, for example, less than or equal to about 15 nm, and a line width roughness of less than or equal to about 10 nm, less than or equal to about 5 nm, less than or equal to about 3 nm, or less than or equal to about 2 nm.

Subsequently, the photoresist pattern 108 is utilized as an etching mask to etch the resist underlayer 104. Through this etching process, an organic layer pattern 112 is formed. The organic layer pattern 112 may also have a width corresponding to that of the photoresist pattern 108.

Figure 5:
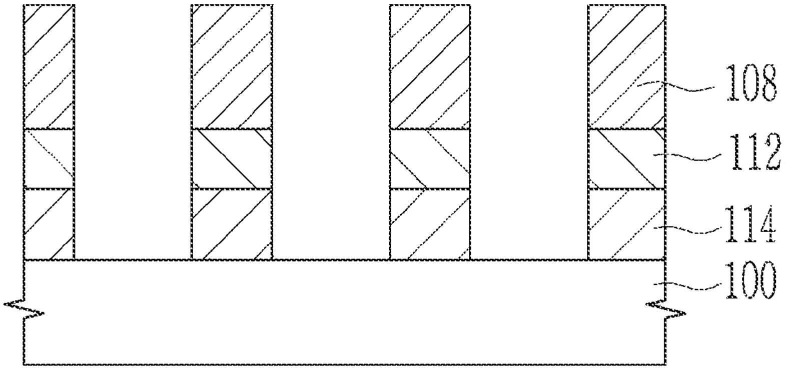

Referring to FIG. 5, the exposed thin film 102 is etched by applying the photoresist pattern 108 as an etching mask. As a result, the thin film is formed as a thin film pattern 114.

The etching of the thin film 102 may be, for example, dry etching utilizing an etching gas, and the etching gas may be, for example, $CHF_3$, $CF_4$, $Cl_2$, $BCl_3$, and/or a mixed gas thereof.

In the exposure process performed, the thin film pattern 114 formed by utilizing the photoresist pattern 108 formed through the exposure process performed by utilizing an EUV light source may have a width corresponding to that of the photoresist pattern 108. For example, the thin film pattern 114 may have a width of about 5 nm to about 100 nm which is equal to that of the photoresist pattern 108. For example, the thin film pattern 114 formed by utilizing the photoresist pattern 108 formed through the exposure process performed by utilizing an EUV light source may have a width of about 5 nm to about 90 nm, about 5 nm to about 80 nm, about 5 nm to about 70 nm, about 5 nm to about 60 nm, about 5 nm to about 50 nm, about 5 nm to about 40 nm, about 5 nm to about 30 nm, or about 5 nm to about 20 nm, and, in some embodiments, a width of less than or equal to about 20 nm, like, substantially similar, or equal to that of the photoresist pattern 108.

Hereinafter, the present disclosure will be described in more detail through examples of the preparation of the aforementioned semiconductor photoresist composition. However, embodiments of the present disclosure are technically not restricted by the following examples.

EXAMPLES

Synthesis of First Organometallic Compound

Synthesis Example 1: Synthesis of Organotin Compound 1

An organotin compound represented by Chemical Formula a-1 (10 g, 26.4 mmol) was dissolved in 30 mL of anhydrous toluene, and 4.8 g of acetic acid was slowly added thereto in a dropwise fashion at 0° C. and then, stirred for 6 hours.

Subsequently, after increasing the temperature to room temperature, the toluene was distilled under vacuum and removed, and the residual liquid was fractionally distilled, obtaining organotin Compound 1 represented by Chemical Formula 1a.

Chemical Formula a-1

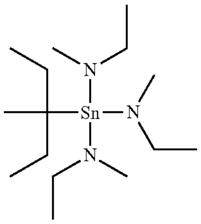

Chemical Formula 1a

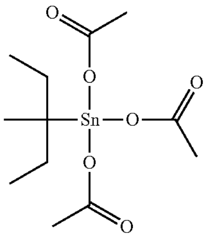

Synthesis Example 2: Synthesis of Organotin Compound 2

A compound represented by Chemical Formula b-1 (10 g, 31.0 mmol) was dissolved in 30 mL of anhydrous toluene, and 8.3 g of isobutyric acid was slowly added thereto in a dropwise fashion at 0° C. and then, stirred for 6 hours.

Subsequently, after increasing the temperature to room temperature, the toluene was distilled under vacuum and removed, and the residual liquid was fractionally distilled, obtaining organotin Compound 2 represented by Chemical Formula 1b.

Chemical Formula b-1

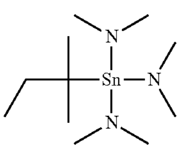

Chemical Formula 1b

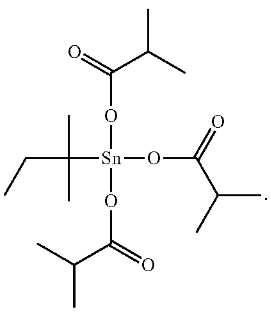.

Synthesis Example 3: Synthesis of Organotin Compound 3

The organotin compound (10 g, 31.0 mmol) represented by Chemical Formula b-1 was dissolved in 30 mL of anhydrous toluene, and 7.0 g of propionic acid was slowly added thereto in a dropwise fashion at 0° C. and then, stirred for 6 hours.

Subsequently, after increasing the temperature to room temperature, the toluene was distilled under vacuum and removed, and the residual liquid was fractionally distilled, obtaining organotin Compound 3 represented by Chemical Formula 1c.

Chemical Formula 1c

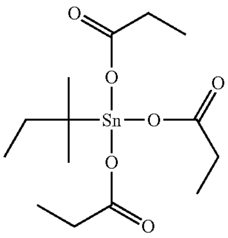

Synthesis Example 4: Synthesis of Organotin Compound 4

The organotin compound (10 g, 25.5 mmol) represented by Chemical Formula d-1 was dissolved in 30 mL of anhydrous toluene, and 6.0 g of propionic acid was slowly added thereto in a dropwise fashion at 0° C. and then, stirred for 6 hours.

Subsequently, after increasing the temperature to room temperature, the toluene was distilled under vacuum and removed, and the residual liquid was fractionally distilled, obtaining organotin Compound 4 represented by Chemical Formula 1d.

Chemical Formula d-1

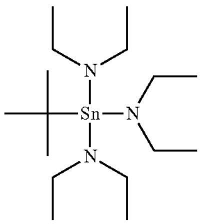

Chemical Formula 1d

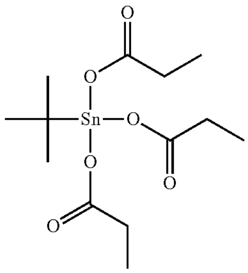

Synthesis Example 5: Synthesis of Organotin Compound 5

The organotin compound (10 g, 25.5 mmol) represented by Chemical Formula d-1 was dissolved in 30 mL of anhydrous toluene, and 6.9 g of isobutyric acid was slowly added thereto in a dropwise fashion at 0° C. and then, stirred for 6 hours.

Subsequently, after increasing the temperature to room temperature, the toluene was distilled under vacuum and removed, and the residual liquid was fractionally distilled, obtaining organotin Compound 5 represented by Chemical Formula 1e.

Chemical Formula 1e

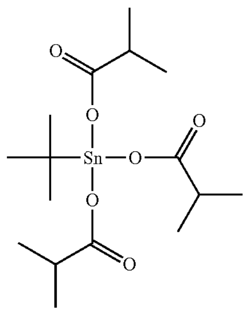

Synthesis of Second Organometallic Compound

Synthesis Example 6: Synthesis of Organotin Compound 6

In a 250 mL 2-necked round-bottomed flask, 20 g (51.9 mmol) of $Ph_3SnCl$ was dissolved in 70 mL of THF and then, cooled to 0° C. in an ice bath. Subsequently, a butyl magnesium chloride (BuMgCl) 1 M THF solution (62.3 mmol) was slowly added thereto in a dropwise fashion. When the addition in a dropwise fashion was completed, the mixture was stirred at 25° C. for 12 hours, obtaining a compound represented by Chemical Formula 2a-1.

Subsequently, the compound represented by Chemical Formula 2a-1 (10 g, 24.6 mmol) was dissolved in 50 mL of $CH_2Cl_2$, and 3 equivalents (73.7 mmol) of a 2 M HCl diethyl ether solution was slowly added thereto in a dropwise fashion at −78° C. for 30 minutes. Subsequently, the mixture was stirred at 25° C. for 12 hours, and the solvent was concentrated and distilled under vacuum, obtaining a compound represented by Chemical Formula 2a-2.

Subsequently, 10 g (25.6 mmol) of the compound represented by Chemical Formula 2a-2 was slowly added in a dropwise fashion to 25 mL of acetic acid at 25° C. and then, heated under reflux for 12 hours. After cooling the temperature to 25° C., the acetic acid was distilled under vacuum, finally obtaining a compound represented by Chemical Formula 2a.

Chemical Formula 2a-1

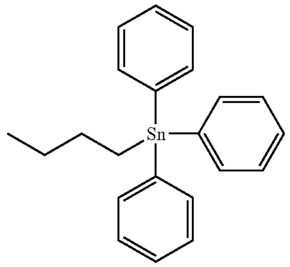

-continued

Chemical Formula 2a-2

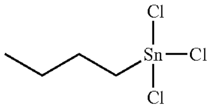

Chemical Formula 2a

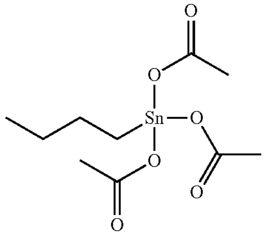

Examples 1 to 5 and Comparative Examples 1 and 2: Preparation of Semiconductor Photoresist Compositions The organotin compound represented by Chemical Formula 1a according to Synthesis Example 1 and the organotin compound represented by Chemical Formula 2a according to Synthesis Example 6 in a weight ratio shown in Table 1 were dissolved in 1-methyl-2-propyl acetate at a concentration of 3 wt % and then, filtered with a 0.1 μm PTFE (polytetrafluoroethylene) syringe filter, preparing a semiconductor photoresist composition.

Formation of Photoresist Layers

A circular silicon wafer having a native-oxide surface and a diameter of 4 inches was utilized as a substrate for thin film deposition and then, treated in a UV ozone cleaning system for 10 minutes before the thin film deposition. On the treated substrate, the semiconductor photoresist compositions according to Examples 1 to 5 and Comparative Examples 1 and 2 were respectively spin-coated at 1500 rpm for 30 seconds and baked (post-apply baked, PAB) at 100° C. for 120 seconds, forming thin films.

Subsequently, when the films were measured with respect to a thickness after the coating and the baking through ellipsometry, the result was 25 nm.

TABLE 1

| | Composition | |
|---|---|---|
| | First organometallic compound (parts by weight) | Second organometallic compound (parts by weight) |
| Example 1 | 99 | 1 |
| Example 2 | 95 | 5 |
| Example 3 | 90 | 10 |
| Example 4 | 80 | 20 |
| Example 5 | 75 | 25 |
| Comparative Example 1 | 100 | 0 |
| Comparative Example 2 | 0 | 100 |

Evaluation 1: Evaluation of Sensitivity and Line Edge Roughness (LER)

EUV light (Lawrence Berkeley National Laboratory Micro Exposure Tool, MET) was projected onto the wafer on which each of the photoresist compositions of Examples 1 to 5, Comparative Examples 1 and 2 was coated, while varying the exposure dose.

Subsequently, the photoresist and the substrate were exposed on a hot plate at 160° C. for 120 seconds for post-exposure baking (PEB). The baked films were respectively dipped in a developing solution (2-heptanone) for 30 seconds and additionally washed with the same developer for 10 seconds, forming negative tone images, that is, removing non-exposed coating regions. Finally, the films were respectively baked on the hot plate at 150° C. for 2 minutes, completing the process.

Using an electron microscope (FE-SEM), optimum energy (Eop) values at which a pattern of a desired or suitable line width (14 nm) were realizable in the line/space (L/S) pattern and line edge roughness (LER) at that time were measured, and the results are shown in Table 2.

Evaluation 2: Evaluation of Storage Stability

In addition, the semiconductor photoresist compositions according to Examples 1 to 5 and Comparative Examples 1 and 2 were evaluated with respect to storage stability, and the results are shown in Table 2.

Storage Stability

When the semiconductor photoresist compositions according to Examples 1 to 5 and Comparative Examples 1 and 2 were allowed to stand at room temperature (20±5° C.) for a certain period, how much precipitates were produced was observed with naked eyes and then, evaluated into two levels according to the following storable criteria.

※ Evaluation criteria

○: can be stored for 6 months or more

X: can be stored for less than 6 months

TABLE 2

| | Sensitivity ($mJ/cm^2$) | LER (nm) | Storage stability |
|---|---|---|---|
| Example 1 | 180 | 1.9 | ○ |
| Example 2 | 190 | 1.8 | ○ |
| Example 3 | 210 | 1.8 | ○ |
| Example 4 | 230 | 1.7 | ○ |
| Example 5 | 240 | 1.7 | ○ |
| Comparative Example 1 | 175 | 2.4 | X |
| Comparative Example 2 | 260 | 2.0 | X |

Referring to the results of Table 2, the patterns formed of the photoresist compositions for a semiconductor according to Examples 1 to 5 exhibited excellent or suitable sensitivity, line edge roughness, and storage stability, compared with the patterns formed of the photoresist compositions for a semiconductor according to Comparative Examples 1 and 2.

As utilized herein, when specific definition is not otherwise provided, '*' indicates a linking point of a structural unit of a compound or a compound moiety.

As utilized herein, the terms "and/or" and "or" may include any and all combinations of one or more of the associated listed items. Expressions such as "at least one of," when preceding a list of elements, modify the entire list of elements and do not modify the individual elements of the list.

Singular expressions may include plural expressions unless the context clearly indicates otherwise. It will be further understood that the terms "comprise", "include" or "have," when utilized in the present disclosure, specify the presence of stated features, integers, steps, operations, elements, and/or components, but do not preclude the presence or addition of one or more other features, integers, steps, operations, elements, components, and/or groups thereof. The "/" utilized below may be interpreted as "and" or as "or" depending on the situation.

As utilized herein, the singular forms "a," "an," and "the" are intended to include the plural forms as well, unless the context clearly indicates otherwise. Further, the use of "may" when describing embodiments of the present disclosure refers to "one or more embodiments of the present disclosure".

As utilized herein, the term "about," or similar terms are used as terms of approximation and not as terms of degree, and are intended to account for the inherent deviations in measured or calculated values that would be recognized by those of ordinary skill in the art.

Any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein.

Hereinbefore, the certain embodiments of the present disclosure have been described and illustrated, however, it is apparent to a person with ordinary skill in the art that the present disclosure is not limited to the embodiments as described, and may be variously modified and transformed without departing from the spirit and scope of the present disclosure. Accordingly, the modified or transformed embodiments as such may not be understood separately from the technical ideas and aspects of the present disclosure, and the modified embodiments are within the scope of the claims of the present disclosure and equivalents thereof.

| Reference Numerals | |
|---|---|
| 100: substrate | 102: thin film |
| 104: resist underlayer | 106: photoresist layer |
| 106a: non-exposed region | 106b: exposed region |
| 108: photoresist pattern | 112: organic layer pattern |
| 114: thin film pattern | |

What is claimed is:

1. A photoresist composition, comprising a first organometallic compound represented by Chemical Formula 1;

a second organometallic compound represented by Chemical Formula 2; and a solvent:

Chemical Formula 1

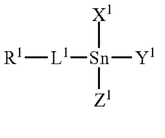

-continued

Chemical Formula 2

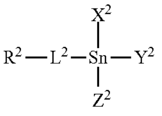

wherein, in Chemical Formula 1 and Chemical Formula 2, $R^1$ and $R^2$ are each independently a substituted or unsubstituted C1 to C20 alkyl group, a substituted or unsubstituted C2 to C20 alkenyl group, a substituted or unsubstituted C2 to C20 alkynyl group, a substituted or unsubstituted C3 to C20 cycloalkyl group, a substituted or unsubstituted C3 to C20 cycloalkenyl group, a substituted or unsubstituted C3 to C20 cycloalkynyl group, a substituted or unsubstituted C1 to C20 alkoxy group, or a combination thereof, $L^1$ and $L^2$ are each independently a single bond, a substituted or unsubstituted C1 to C20 alkylene group, a substituted or unsubstituted C2 to C20 alkenylene group, a substituted or unsubstituted C2 to C20 alkynylene group, or a combination thereof, at least one selected from among $R^1$ and $L^1$ comprises a tertiary carbon, at least one selected from among $R^2$ and $L^2$ comprises at least one selected from among a primary carbon and a secondary carbon, $X^1$, $X^2$, $Y^1$, $Y^2$, $Z^1$, and $Z^2$ are each independently —$OR^a$, —$SR^b$, —OC(═O)$R^c$, or —SC(═O)$R^d$, $R^a$ and $R^b$ are each independently a substituted or unsubstituted C1 to C20 alkyl group, a substituted or unsubstituted C3 to C20 cycloalkyl group, a substituted or unsubstituted C2 to C20 alkenyl group, a substituted or unsubstituted C2 to C20 alkynyl group, a substituted or unsubstituted C6 to C30 aryl group, or a combination thereof, and $R^c$ and $R^d$ are each independently hydrogen, a substituted or unsubstituted C1 to C20 alkyl group, a substituted or unsubstituted C3 to C20 cycloalkyl group, a substituted or unsubstituted C2 to C20 alkenyl group, a substituted or unsubstituted C2 to C20 alkynyl group, a substituted or unsubstituted C6 to C30 aryl group, or a combination thereof.

2. The photoresist composition of claim 1, wherein $R^1$ in Chemical Formula 1 is a substituted or unsubstituted C1 to C20 alkyl group, a substituted or unsubstituted C2 to C20 alkenyl group, a substituted or unsubstituted C2 to C20 alkynyl group, a substituted or unsubstituted C1 to C20 alkoxy group, or a combination thereof, $L^1$ in Chemical Formula 1 is a single bond, or a substituted or unsubstituted C1 to C20 alkylene group, and at least one selected from among $R^1$ and $L^1$ comprises a tertiary carbon.

3. The photoresist composition of claim 1, wherein the first organometallic compound is represented by Chemical Formula 1-1 or Chemical Formula 1-2:

Chemical Formula 1-1

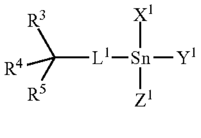

-continued

Chemical Formula 1-2

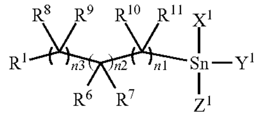

wherein, in Chemical Formula 1-1 and Chemical Formula 1-2, $R^3$ to $R^7$ are each independently a substituted or unsubstituted C1 to C10 alkyl group, a substituted or unsubstituted C2 to C10 alkenyl group, a substituted or unsubstituted C2 to C10 alkynyl group, a substituted or unsubstituted C3 to C10 cycloalkyl group, a substituted or unsubstituted C3 to C10 cycloalkenyl group, a substituted or unsubstituted C3 to C10 cycloalkynyl group, a substituted or unsubstituted C1 to C10 alkoxy group, or a combination thereof, $L^1$ is a single bond, a substituted or unsubstituted C1 to C20 alkylene group, a substituted or unsubstituted C2 to C20 alkenylene group, a substituted or unsubstituted C2 to C20 alkynylene group, or a combination thereof, $R^1$ is a substituted or unsubstituted C1 to C10 alkyl group, a substituted or unsubstituted C2 to C10 alkenyl group, a substituted or unsubstituted C2 to C10 alkynyl group, a substituted or unsubstituted C3 to C10 cycloalkyl group, a substituted or unsubstituted C3 to C10 cycloalkenyl group, a substituted or unsubstituted C3 to C10 cycloalkynyl group, a substituted or unsubstituted C1 to C10 alkoxy group, or a combination thereof, $R^8$ to $R^{11}$ are each independently hydrogen, a substituted or unsubstituted C1 to C10 alkyl group, a substituted or unsubstituted C3 to C10 cycloalkyl group, a substituted or unsubstituted C2 to C10 alkenyl group, a substituted or unsubstituted C2 to C10 alkynyl group, a substituted or unsubstituted C6 to C20 aryl group, or a combination thereof, n1 and n3 are each independently an integer of 0 to 5, n2 is one of integers from 1 to 5, $X^1$, $Y^1$, and $Z^1$ are each independently —$OR^a$, —$SR^b$, —OC(=O)$R^c$, or —SC(=O)$R^d$, $R^a$ and $R^b$ are each independently a substituted or unsubstituted C1 to C20 alkyl group, a substituted or unsubstituted C3 to C20 cycloalkyl group, a substituted or unsubstituted C2 to C20 alkenyl group, a substituted or unsubstituted C2 to C20 alkynyl group, a substituted or unsubstituted C6 to C30 aryl group, or a combination thereof, and $R^c$ and $R^d$ are each independently hydrogen, a substituted or unsubstituted C1 to C20 alkyl group, a substituted or unsubstituted C3 to C20 cycloalkyl group, a substituted or unsubstituted C2 to C20 alkenyl group, a substituted or unsubstituted C2 to C20 alkynyl group, a substituted or unsubstituted C6 to C30 aryl group, or a combination thereof.

4. The photoresist composition of claim 1, wherein $R^2$ in Chemical Formula 2 is a substituted or unsubstituted C1 to C20 alkyl group, a substituted or unsubstituted C2 to C20 alkenyl group, a substituted or unsubstituted C2 to C20 alkynyl group, a substituted or unsubstituted C1 to C20 alkoxy group, or a combination thereof, $L^2$ in Chemical Formula 2 is a single bond, or a substituted or unsubstituted C1 to C20 alkylene group, and at least one selected from among $R^2$ and $L^2$ comprises at least one selected from a primary carbon and a secondary carbon.

5. The photoresist composition of claim 1, wherein the second organometallic compound is represented by any one selected from among Chemical Formula 2-1 to Chemical Formula 2-4:

Chemical Formula 2-1

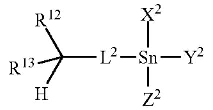

Chemical Formula 2-2

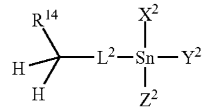

Chemical Formula 2-3

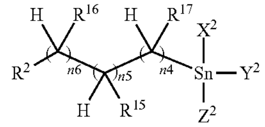

Chemical Formula 2-4

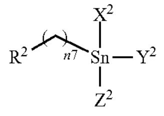

wherein, in Chemical Formula 2-1 to Chemical Formula 2-4, $R^{12}$ to $R^{15}$ are each independently a substituted or unsubstituted C1 to C10 alkyl group, a substituted or unsubstituted C2 to C10 alkenyl group, a substituted or unsubstituted C2 to C10 alkynyl group, a substituted or unsubstituted C3 to C10 cycloalkyl group, a substituted or unsubstituted C3 to C10 cycloalkenyl group, a substituted or unsubstituted C3 to C10 cycloalkynyl group, a substituted or unsubstituted C1 to C10 alkoxy group, or a combination thereof, $L^2$ is a single bond, a substituted or unsubstituted C1 to C20 alkylene group, a substituted or unsubstituted C2 to C20 alkenylene group, a substituted or unsubstituted C2 to C20 alkynylene group, or a combination thereof, $R^2$ is a substituted or unsubstituted C1 to C10 alkyl group, a substituted or unsubstituted C2 to C10 alkenyl group, a substituted or unsubstituted C2 to C10 alkynyl group, a substituted or unsubstituted C3 to C10 cycloalkyl group, a substituted or unsubstituted C3 to C10 cycloalkenyl group, a substituted or unsubstituted C3 to C10 cycloalkynyl group, a substituted or unsubstituted C1 to C10 alkoxy group, or a combination thereof, $R^{16}$ and $R^{17}$ are each independently hydrogen, a substituted or unsubstituted C1 to C10 alkyl group, a substituted or unsubstituted C3 to C10 cycloalkyl group, a substituted or unsubstituted C2 to C10 alkenyl group, a substituted or unsubstituted C2 to C10 alkynyl group, a substituted or unsubstituted C6 to C20 aryl group, or a combination thereof, n5 and n7 are each independently an integer of 1 to 5, n4 and n6 are each independently an integer of 0 to 5, $X^2$, $Y^2$, and $Z^2$ are each independently —$OR^a$, —$SR^b$, —OC(=O)$R^c$, or —SC(=O)$R^d$, $R^a$ and $R^b$ are each independently a substituted or unsubstituted C1 to C20 alkyl group, a substituted or unsubstituted C3 to C20 cycloalkyl group, a substituted or unsubstituted C2 to C20 alkenyl group, a substituted or unsubstituted C2 to C20 alkynyl group, a substituted or unsubstituted C6 to C30 aryl group, or a combination thereof, and $R^c$ and $R^d$ are each independently hydrogen, a substituted or unsubstituted C1 to C20 alkyl group, a substituted or unsubstituted C3 to C20 cycloalkyl group, a substituted or unsubstituted C2 to C20 alkenyl group, a substituted or unsubstituted C2 to C20 alkynyl group, a substituted or unsubstituted C6 to C30 aryl group, or a combination thereof.

6. The photoresist composition of claim 1, wherein $X^1$, $X^2$, $Y^1$, $Y^2$, $Z^1$, and $Z^2$ are each independently —$OR^a$ or —$OC(=O)R^c$, $R^a$ is each independently a substituted or unsubstituted C1 to C10 alkyl group, a substituted or unsubstituted C3 to C10 cycloalkyl group, a substituted or unsubstituted C2 to C10 alkenyl group, a substituted or unsubstituted C2 to C10 alkynyl group, a substituted or unsubstituted C6 to C20 aryl group, or a combination thereof, $R^c$ is hydrogen, a substituted or unsubstituted C1 to C10 alkyl group, a substituted or unsubstituted C3 to C10 cycloalkyl group, a substituted or unsubstituted C2 to C10 alkenyl group, a substituted or unsubstituted C2 to C10 alkynyl group, a substituted or unsubstituted C6 to C20 aryl group, or a combination thereof.

7. The photoresist composition of claim 1, wherein

*-$L^1$-$R^1$ in Chemical Formula 1 is a tert-butyl group, a tert-pentyl group, a tert-hexyl group, a tert-heptyl group, a tert-octyl group, a tert-nonyl group, or a tert-decyl group, and

*-$L^2$-$R^2$ in Chemical Formula 2 is an n-propyl group, an n-butyl group, an n-pentyl group, an n-hexyl group, an n-heptyl group, an n-octyl group, an n-nonyl group, an n-decyl group, an iso-propyl group, an iso-butyl group, an iso-pentyl group, an iso-hexyl group, an iso-heptyl group, an iso-octyl group, an iso-nonyl group, an iso-decyl group, a sec-butyl group, a sec-pentyl group, a sec-hexyl group, a sec-heptyl group, or a sec-octyl group.

8. The photoresist composition of claim 1, wherein the first organometallic compound and the second organometallic compound are in a weight ratio of about 99.9:0.1 to about 50:50.

9. The photoresist composition of claim 1, wherein the first organometallic compound and the second organometallic compound are in a weight ratio of about 99:1 to about 70:30.

10. The photoresist composition of claim 1, wherein based on 100 wt % of the photoresist composition, a total amount of an organometallic compound comprising the first organometallic compound and the second organometallic compound is about 0.5 wt % to about 30 wt %.

11. The photoresist composition of claim 1, wherein the photoresist composition further comprises an additive of a surfactant, a crosslinking agent, a leveling agent, or a combination thereof.

12. A method of forming patterns, the method comprising applying an etching target layer on a substrate;

coating the photoresist composition of claim 1 on the etching target layer to form a photoresist layer;

patterning the photoresist layer to form a photoresist pattern; and etching the etching target layer utilizing the photoresist pattern as an etching mask.

13. The method of claim 12, wherein the photoresist pattern is formed utilizing light in a wavelength of about 5 nm to about 150 nm.

14. The method of claim 12, further comprising:

applying a resist underlayer between the etching target layer and the photoresist layer.

15. The method of claim 12, wherein the photoresist pattern has a width of about 5 nm to about 100 nm.

16. The method of claim 12, wherein

*-$L^1$-$R^1$ in Chemical Formula 1 is a tert-butyl group, a tert-pentyl group, a tert-hexyl group, a tert-heptyl group, a tert-octyl group, a tert-nonyl group, or a tert-decyl group, and

*-$L^2$-$R^2$ in Chemical Formula 2 is an n-propyl group, an n-butyl group, an n-pentyl group, an n-hexyl group, an n-heptyl group, an n-octyl group, an n-nonyl group, an n-decyl group, an iso-propyl group, an iso-butyl group, an iso-pentyl group, an iso-hexyl group, an iso-heptyl group, an iso-octyl group, an iso-nonyl group, an iso-decyl group, a sec-butyl group, a sec-pentyl group, a sec-hexyl group, a sec-heptyl group, or a sec-octyl group.

17. The method of claim 12, wherein the first organometallic compound and the second organometallic compound are in a weight ratio of about 99.9:0.1 to about 50:50.

18. The method of claim 12, wherein the first organometallic compound and the second organometallic compound are in a weight ratio of about 99:1 to about 70:30.

19. The method of claim 12, wherein based on 100 wt % of the photoresist composition, a total amount of the first organometallic compound and the second organometallic compound is about 0.5 wt % to about 30 wt %.

20. The method of claim 12, wherein the photoresist layer is formed by a heat treatment at about 80° C. to about 120° C. after the coating of the photoresist composition.

* * * * *